US 9,548,604 B2

(12) United States Patent
Moreno et al.

(10) Patent No.: US 9,548,604 B2
(45) Date of Patent: Jan. 17, 2017

(54) SYSTEM FOR BATTERY MANAGEMENT AND PROTECTION

(71) Applicant: Fairchild Semiconductor Corporation, San Jose, CA (US)

(72) Inventors: Tomas Andres Moreno, San Jose, CA (US); Joseph D. Montalbo, Menlo Park, CA (US); Sung Geun Yoon, Cupertino, CA (US); Roger Yeung, Burlingame, CA (US)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 176 days.

(21) Appl. No.: 14/293,261

(22) Filed: Jun. 2, 2014

(65) Prior Publication Data
US 2014/0354238 A1 Dec. 4, 2014

Related U.S. Application Data

(60) Provisional application No. 61/830,095, filed on Jun. 1, 2013.

(51) Int. Cl.
*H02H 3/00* (2006.01)
*H02H 3/087* (2006.01)
*H02H 7/18* (2006.01)

(52) U.S. Cl.
CPC ............ *H02H 3/087* (2013.01); *H02H 3/006* (2013.01); *H02H 7/18* (2013.01)

(58) Field of Classification Search
None
See application file for complete search history.

(56) References Cited

U.S. PATENT DOCUMENTS

| 5,994,878 | A  | * | 11/1999 | Ostergaard | ............ | H02J 7/0004 320/132 |
| 6,804,100 | B2 | * | 10/2004 | Astala     | ................. | H02J 7/0029 320/134 |
| 6,917,117 | B2 | * | 7/2005  | Chien      | ..................... | H01L 24/81 257/778 |
| 7,019,493 | B2 | * | 3/2006  | Astala     | ................. | H02J 320/134 320/134 |

(Continued)

OTHER PUBLICATIONS

Bulut, "New Thermally Enhanced Packages for Power MOSFETs in Battery Pack Applications," 2002 Electronic Components and Technology Conference, pp. 1762-1764.*

(Continued)

*Primary Examiner* — Leigh Garbowski
(74) *Attorney, Agent, or Firm* — Grossman Tucker Perreault & Pfleger PLLC (57) ABSTRACT

The present disclosure is directed to a system for battery management and protection. A battery protection circuit may include a power semiconductor switch and a control integrated circuit (IC). The battery protection circuit may be configured to regulate the charging and/or discharging of a battery and further prevent the battery from operating outside of a safe operating area based on a protection trip point (e.g. overcurrent detection point) of the protection IC. The protection IC may be configured to calibrate a protection trip point so as to compensate for process and temperature variations of on resistance (RSSon) of the power semiconductor switch.

12 Claims, 12 Drawing Sheets

(56) References Cited

U.S. PATENT DOCUMENTS

| | | | |
|---|---|---|---|
| 7,605,435 B2 * | 10/2009 | Anderson | H01L 29/861 257/121 |
| 7,772,704 B2 * | 8/2010 | Yoshida | H01L 23/4824 257/288 |
| 7,868,432 B2 | 1/2011 | Lee et al. | |
| 8,003,447 B2 | 8/2011 | Lee et al. | |
| 9,219,061 B2 * | 12/2015 | Suzuki | H01L 27/088 |

OTHER PUBLICATIONS

Pavier et al., "Bi-directional FlipFET™ MOSFETs for Cell Phone Battery Protection Circuits," International Rectifier, PCIM 2001, 6 pages.*

Yi Wang, Application of Semiconductor IC in Protection Circuit of Lithium Ion Battery, China Academic Journal Electronic Publishing House, Microelectronic Technology, Jun. 2002, 7 pages, vol. 30, No. 3, Issue No. 145. English language translation, 22 pages.

* cited by examiner

FIG. 13

SYSTEM FOR BATTERY MANAGEMENT AND PROTECTION

PRIORITY

The instant patent application claims the benefit of U.S. provisional patent application 61/830,095 filed on Jun. 1, 2013 and entitled "System for Battery Management and Protection," the contents of the provisional application being incorporated herein, in entirety, by reference.

FIELD

The present disclosure relates to battery management systems, and, more particularly, to a battery protection circuit including a protection integrated circuit (IC) configured to calibrate a protection trip point to compensate for process and temperature variations of on resistance of a power semiconductor switch of the battery protection circuit.

BACKGROUND

Various monitoring systems for batteries exist. For example, battery management systems may be configured to manage a battery (cell or battery pack), such as by monitoring the battery state, calculating and reporting secondary data, protecting the battery, controlling the battery's environment, and/or balancing the charge/discharge of the battery. Some battery management systems may monitor the state of the battery as represented by various parameters, including, but not limited to, voltage (e.g. total voltage, voltage of periodic taps or voltages of individual cells), temperature (e.g. average temperature, coolant intake temperature, coolant output temperature or temperatures of individual cells), state of charge (SOC) or depth of discharge (DOD) to indicate the charge level of the battery and current in and/or out of the battery.

Some battery management systems include protection mechanisms configured to prevent the battery from operating outside of a predefined safe operating area. Battery protection mechanisms have become increasingly important, particularly as technology has advanced and many everyday consumer products rely on rechargeable batteries, such as, for example, lithium ion batteries, for power. If a lithium ion battery, for example, overcharges, strong exothermic reactions are possible and the potential for causing a fire increases, presenting a dangerous condition for the user.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

By way of overview, the present disclosure is directed to a battery protection circuit including the integration of a power semiconductor switch and a power integrated circuit (IC). The battery protection circuit is configured to regulate the charging and/or discharging of a battery and further prevent the battery from operating outside of a safe operating area based, at least in part, on a protection trip point (e.g. over current detection point) of the protection IC.

The protection IC may be configured to calibrate a protection trip point so as to compensate for process and temperature variations of source-to-source on state resistance (RSSon) of the power semiconductor switch. The power semiconductor switch may comprise, for example, a dual n-channel metal-oxide-semiconductor field-effect transistor (MOSFET) including two coupled MOSFET switches, wherein the protection IC is configured to control the MOSFET switches and thereby control the flow of current into and/or out of the battery. The protection IC may be configured using the RSSon of each MOSFET switch in that a protection trip point may be calibrated (e.g., via a trimming technique) based on the actual RSSon for each MOSFET. The battery protection circuit may be configured to provide at least one of over-discharge voltage protection, over-charge voltage protection, over-discharge current protection, over-charge current protection and short circuit protection.

As described in greater detail herein, calibration of the protection trip point based on the actual RSS of each MOSFET results in improved accuracy of detecting current flow during charging and/or discharging of the battery, thereby resulting in improved battery efficiency and performance such as, for example, increased talk time for a mobile device. As an additional benefit, a battery protection circuit consistent with the present disclosure may be reduced in size when compared to current battery protection mechanisms, as described in greater detail herein.

Figure 1:
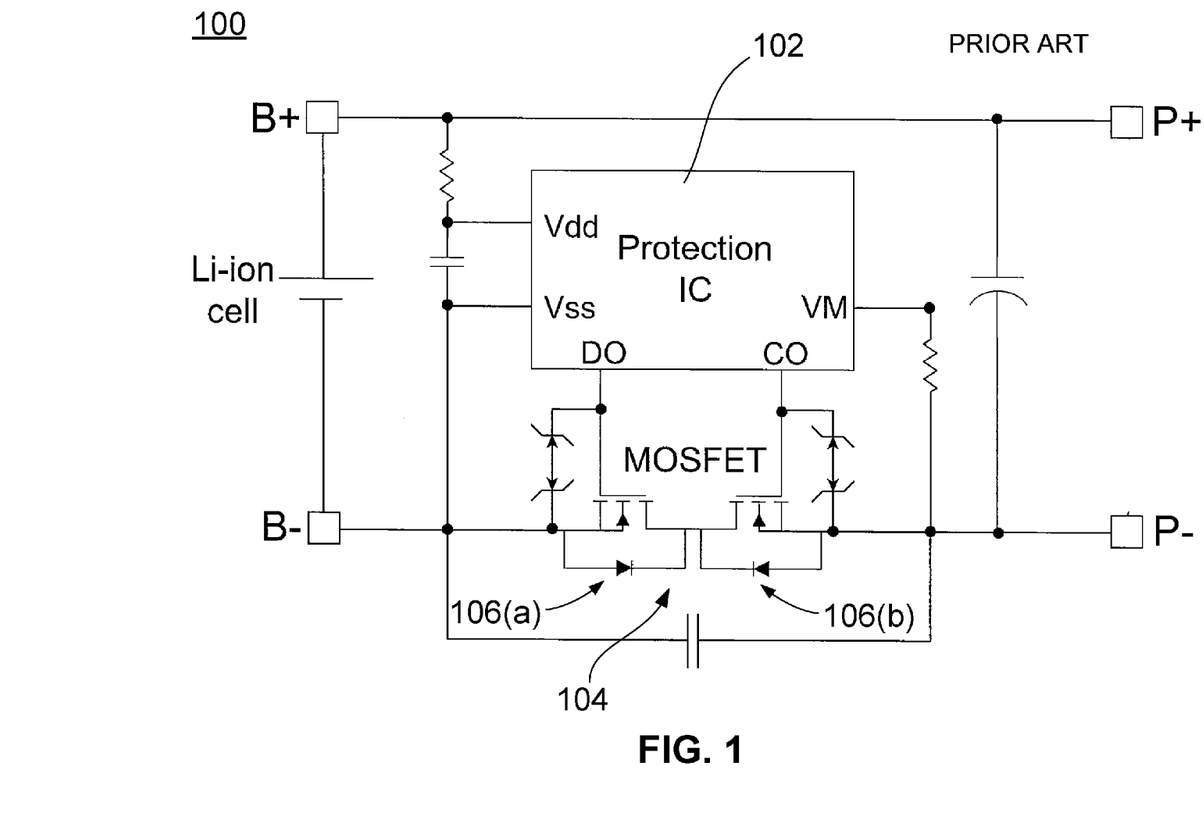
FIG. 1 illustrates a conventional battery protection circuit diagram.

FIG. 1 illustrates a conventional battery protection circuit 100. As shown, the battery protection circuit 100 may comprise, among other components, dual n-channel MOSFET 104 including two MOSFET switches 106(a), 106(b) and protection IC 102. In the disclosed circuit, MOSFET 106(b) may prevent current from flowing into the battery (e.g., coupled to the charge output (CO) of protection IC 102), while MOSFET 106(b) may prevent current from flowing from the battery unless the control IC 102 enables it (e.g., coupled to the discharge output (DO) of protection IC 102).

Figure 2A:
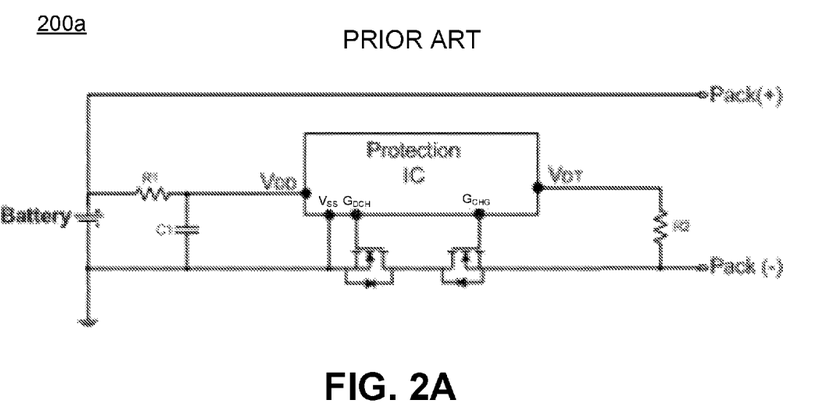
FIGS. 2A-2D illustrate embodiments of conventional battery protection circuit diagrams.
Figure 2B:
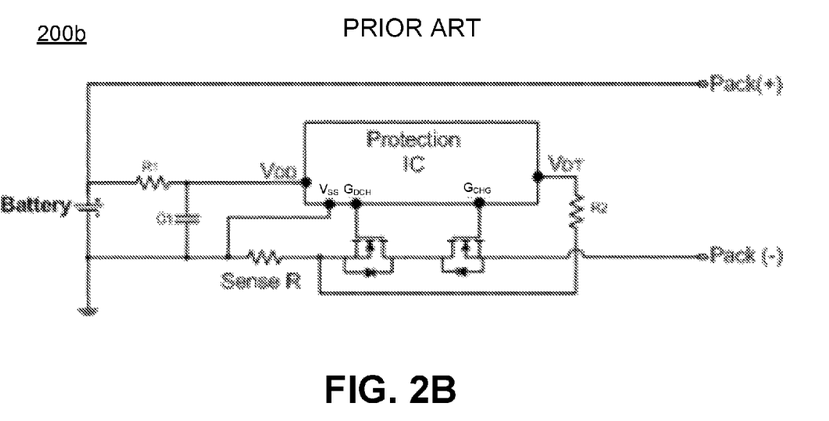
Figure 2C:
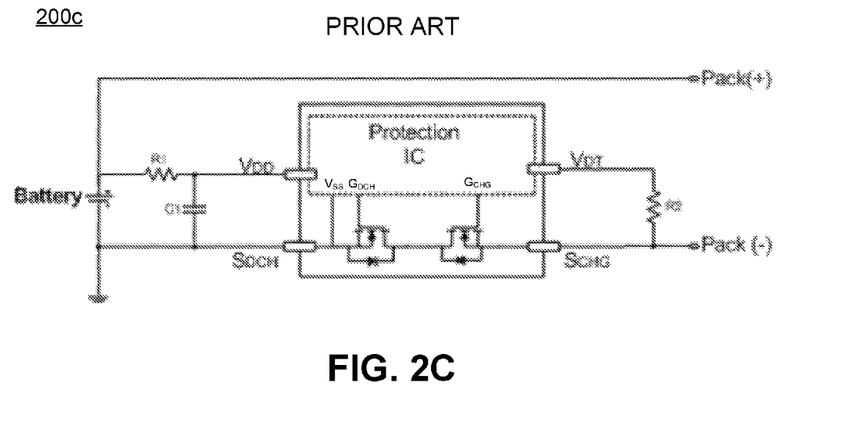
Figure 2D:
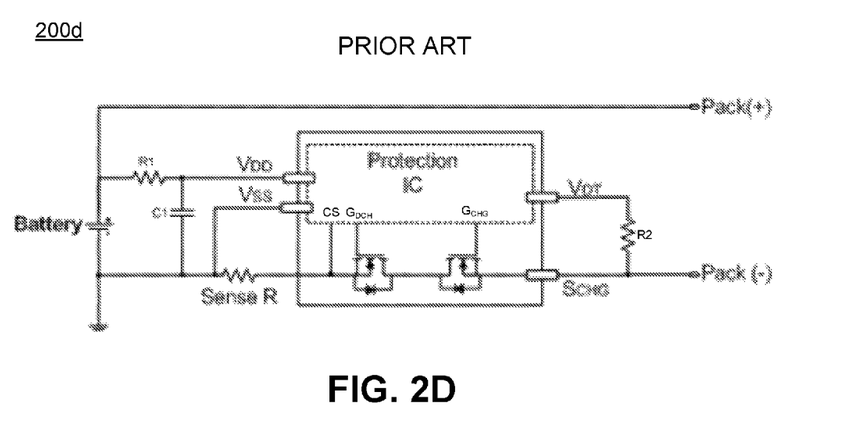

FIGS. 2A-2D illustrate other embodiments of conventional battery protection circuits. As shown in FIG. 2A, battery protection circuit 200a discloses a discrete approach to battery protection while battery protection circuit 200b of FIG. 2B enhances the discrete approach by incorporating sense resistor R. Battery protection circuit 200c of FIG. 2C discloses an MCM approach (e.g., wherein discrete components such as the MOSFETs are included in a single chip package) and the circuit 200d of FIG. 2D combines the MCM approach with external sense resistor R. However, each of battery protection circuits 200a-200d have drawbacks. For example, the discrete approach disclosed in circuits 200a and 200c generally exhibit poor protection trip accuracy due to, for example, the unpredictable real-world characteristics of the discrete components. While the inclusion of sense resistor R into circuits 200b and 200d may improve protection trip accuracy, the inclusion of sense resistor R also increases the cost, increases the space required for manufacturing and may further result in overall power loss.

Generally, customers that use discrete MOSFET switches have little or no tolerance for power loss resulting from sense resistor R. Furthermore, the industry has been serviced by separate IC vendors and MOSFET vendors, such that there has been little, if any, motivation to address poor accuracy issues of current battery protection circuits. With the ever increasing power requirements in electronic devices, such as tablets and smartphones, the loss associated with the protection accuracy is becoming less and less tolerable. The current trend for battery powered mobile electronic devices is the requirement for higher discharge and charge currents (e.g. up to 5 A~8 A) due, in part, to multi-core systems and fast charging requirements for such devices. Additionally, mobile electronic devices (e.g. thin tablets and smartphones) are smaller in size, and thus require smaller components, have space for fewer components, etc., such that integrated solutions which reduce component count and/or size are valuable.

Figure 3:
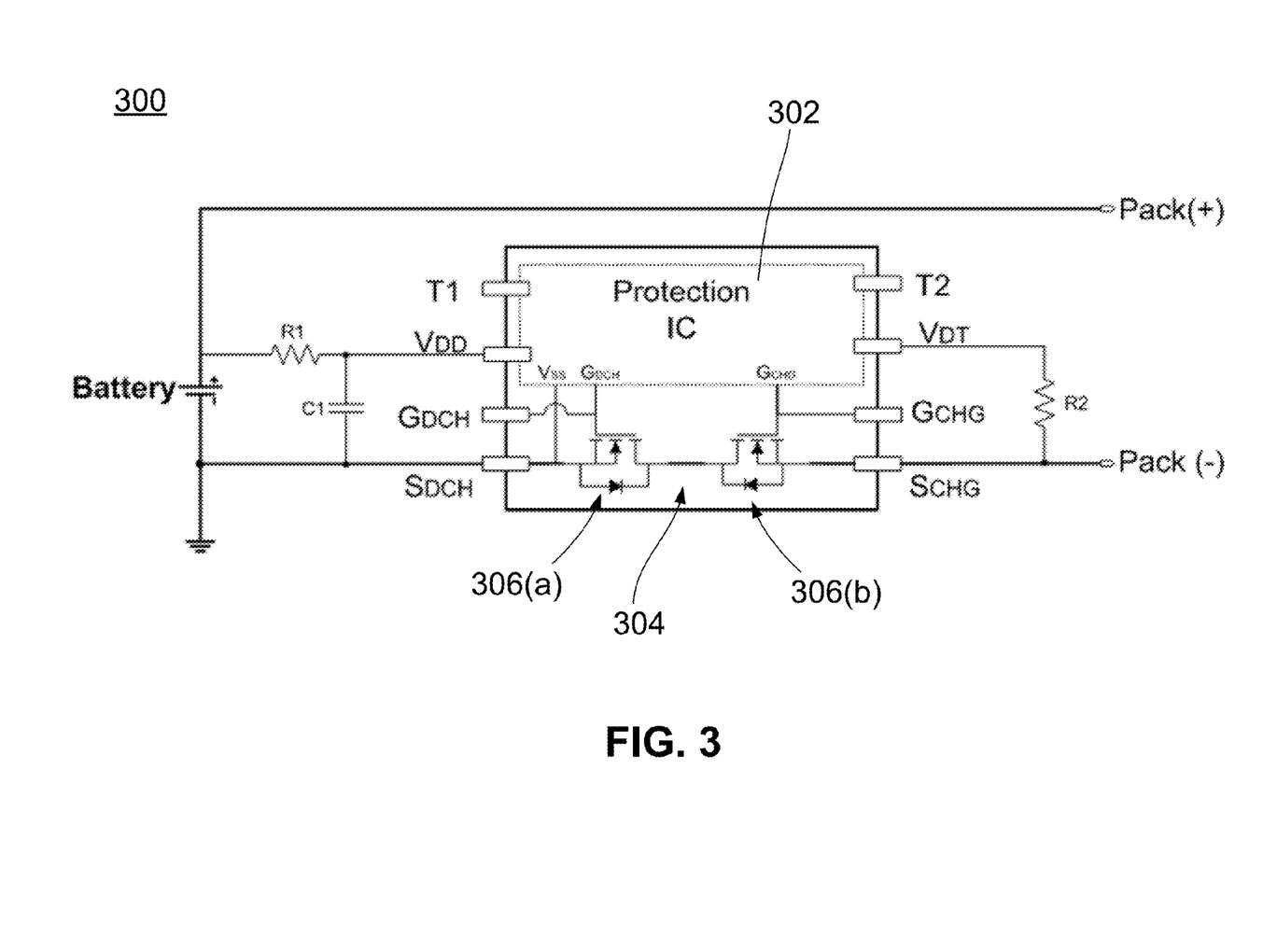
FIG. 3 illustrates an example battery protection circuit diagram consistent with the present disclosure.

FIG. 3 illustrates battery protection circuit 300 consistent with the present disclosure. As shown, circuit 300 may comprise at least protection IC 302 and dual n-channel MOSFET 304 including two MOSFET switches 306(a) and 306(b). As previously described, battery protection circuit 300 may be configured to regulate the charging and/or discharging of a battery and further prevent the battery from operating outside of a safe operating area based, at least in part, on a protection trip point (e.g. overcurrent detection point) of protection IC 302. Protection IC 302 may be configured to control MOSFET switches 306(a) and 306(b) and thereby control the flow of current into and/or out of the battery.

For purposes of clarity, the connections (e.g. pins) illustrated in the diagram of FIG. 3 will be described. VDD represents a connection pin coupled to the positive power supply input for supplying power to protection IC 302. VSS may serve as a reference point for protection IC 302 and may be coupled to the negative terminal of the battery. VDT represents a pin used for detecting overcurrent and/or the presence of a battery charger. P+ is the positive terminal of the battery pack and P− is the negative terminal of the battery pack. GDCH is a gate driver pin for controlling discharge MOSFET 306(a) and SDCH may be connected to the source of the discharge MOSFET 306(a). GCHG is a gate driver pin for controlling charge MOSFET 306(b) and SCHG may be connected to the source of charge MOSFET 306(b). T1 and T2 correspond to test pins that may be used for the calibration of the protection trip point of the protection IC 302. For example, the T1 and T2 trip points provide access to protection IC 302 through which the trip points may be programmed (e.g., by the factory, an original equipment manufacturer (OEM) or another party) with respect to the RSSon of any MOSFET switches 306(a) and 306(b).

Protection IC 302 may be configured to include a protection trip point that may be calibrated so as to compensate for process and temperature variations in the RSSon of MOSFET switches 306(a) and 306(b). In practice, MOSFET switches 306(a) and 306(b) may include significant RSSon variation across process and temperature. Consistent with the present disclosure, protection IC 302 may be configured based on a measured RSSon corresponding to at least one of MOSFET switches 306(a) and 306(b), wherein the protection trip point may be calibrated (e.g. using a trimming technique wherein the protection trip point may be adjusted in protection IC 302 based on the actual RSSon). This calibration allows protection IC 302 to customize its control based on the operational characteristics of MOSFETS 306(a) and 306(b) resulting from process and/or temperature variation, thereby improving protection accuracy.

The ability of protection IC 302 to calibrate the protection trip point to compensate for at least RSSon variation allows battery protection circuit 300 to provide improved protection accuracy that may not otherwise be realized in conventional protection circuits. For example, an overcurrent protection trip point may be initially set at 2 A, such that any current flowing through an IC greater than 2 A would cause protection IC 302 to turn off one or both MOSFET switches 306(a) and 306(b), thereby discontinuing current inflow to, or current outflow from, the battery.

In order for protection IC 302 to trip, the IC generally needs to measure the Voltage drop across the pair of MOSFET switches based on resistance. In one example, at 25° C. (Celsius) MOSFET switches 306(a) and 306(b) may have an RSSon of 10 mohm. For protection IC 302 to trip at 2 A, the protection trip point of protection IC 302 would need to be pre-set at 20 mV (e.g. V=IR=2 A∴10 mohm). In an ideal case where there is little or no process variation and/or temperature variation, the protection accuracy would approach 100%. However, in practice the actual RSSon of a MOSFET may not be exactly 10 mohm. In some MOSFETs the RSSon might be as low as 6 mohm, while other MOSFETs might have an RSSon of 12 mohm. Variation exists from MOSFET to MOSFET. For example, given that a MOSFET has an actual RSSon of 6 mohm and protection IC 302 has a pre-set protection trip point of 20 mV, protection IC 302 may enter a protection mode (e.g., disabling charge and/or discharge currents) at 3.333 A (I=V/R=20 mV/6 mohm), resulting in a tolerance of 66% above the 2 A target. When the MOSFET instead has an RSSon of 12 mohm, protection IC 302 may enter a protection mode at 1.66 A (I=V/R=20 mV/12 mohm), resulting in a tolerance of 17% below the 2 A target. Accordingly, the ability of the protection IC 302 to measure and sense the RSSon of the MOSFET switches 306(a) and 306(b), and in turn calibrate the protection trip point based on the actual RSSon for MOSFET switches 306(a) and 306(b), allows protection IC 302 to compensate for any process and/or temperature of the MOSFET switches, thereby improving protection accuracy. For example, in the 6 mohm scenario described above, protection IC 302 may be configured to trim the protection trip point at 12 mV (V=IR=2 A×6 mohm) yielding a more accurate protection trip point approximating 2 A.

The following tables illustrate test results corresponding to the protection accuracy of conventional battery protection circuitry (such as those shown in FIG. 1 or 2A-2D designated as "conventional") compared to the protection accuracy of battery protection circuitry consistent with the present disclosure as shown in FIG. 3 designated as "Calibrating IC". The results of Table 1 are based on a discharge overcurrent protection (OCP) trip level in amps (A), wherein the maximum OCP trip level was set at 3 A (e.g., current safety regulations disallow a trip level greater than 3 A) while the battery capacity was assumed to be at 2200 mAh.

TABLE 1

|  | min | typical | Max | Tolerance | Utilization in A in 1 hr | Utilization in % in 1 hr |
|---|---|---|---|---|---|---|
| Conventional | 1.6 | 2.3 | 3 | +/−30% | 1.6 | 73% |
| Calibrating IC | 2.2 | 2.6 | 3 | +/−15% | 2.2 | 100% |

As shown, the conventional protection circuitry may trip as low as at 1.6 A. If the battery capacity is 2200 mAh, the conventional protection circuitry only allows a load to draw a maximum of 1.6 A in one hour, resulting in 600 mA wasted in 1 hour. Accordingly, the battery capacity utilization rate is approximately 73%. In regard to the calibrating IC, the OCP might trip as low as at 2.2 A. If the battery capacity is 2200 mAh, the calibrating IC allows the load to draw a maximum of 2.2 A in 1 hour, resulting in 0 mA being wasted in 1 hour. Accordingly, the battery capacity utilization rate is 100%. Based on average market price of $4.05 for a 2200 mAh battery cell, the conventional circuitry captures only $2.95 of the $4.05 cost of the battery cell, wasting $1.10. The calibrating IC circuitry yields a battery cap utilization rate of 100% and a full return of a $4.05 on the battery cell. As such, the potential cost saving from using the calibrating IC circuitry is $1.10.

The results shown in Table 2 are based on the discharge overcurrent protection (OCP) trip level in amps (A), wherein the specific application required 1.75 A and a minimum OCP was set at 1.75 A to guarantee operation.

TABLE 2

|  | Min | typical | max | Tolerance |
|---|---|---|---|---|
| Conventional | 1.75 | 2.5 | 3.25 | +/−30% |
| Calibrating IC | 1.75 | 2.05 | 2.36 | +/−15% |

As illustrated in table 2, the conventional circuitry OCP may trip at as high as 3.25 A. In order to meet the discharge safety requirement of a typical battery cell, the customer would need to buy a 2200 mAh size battery cell. Buying a smaller sized battery cell might not provide the level of discharge OCP required. The calibrating IC may trip as high as at 2.36 A. As such, to meet the discharge safety requirement of a typical battery cell, customer would only need to buy a 1600 mAh size battery cell. Accordingly, the conventional circuit may require a 2200 mAh battery that is 37% larger than the 1600 mAh battery usable with the calibrating IC circuitry. A 2200 mAh battery cell may cost as much as 50% more than a 1600 mAh battery cell, and thus, a designer may end up with a bulkier and more expensive battery cell with a conventional circuit.

Figure 4:
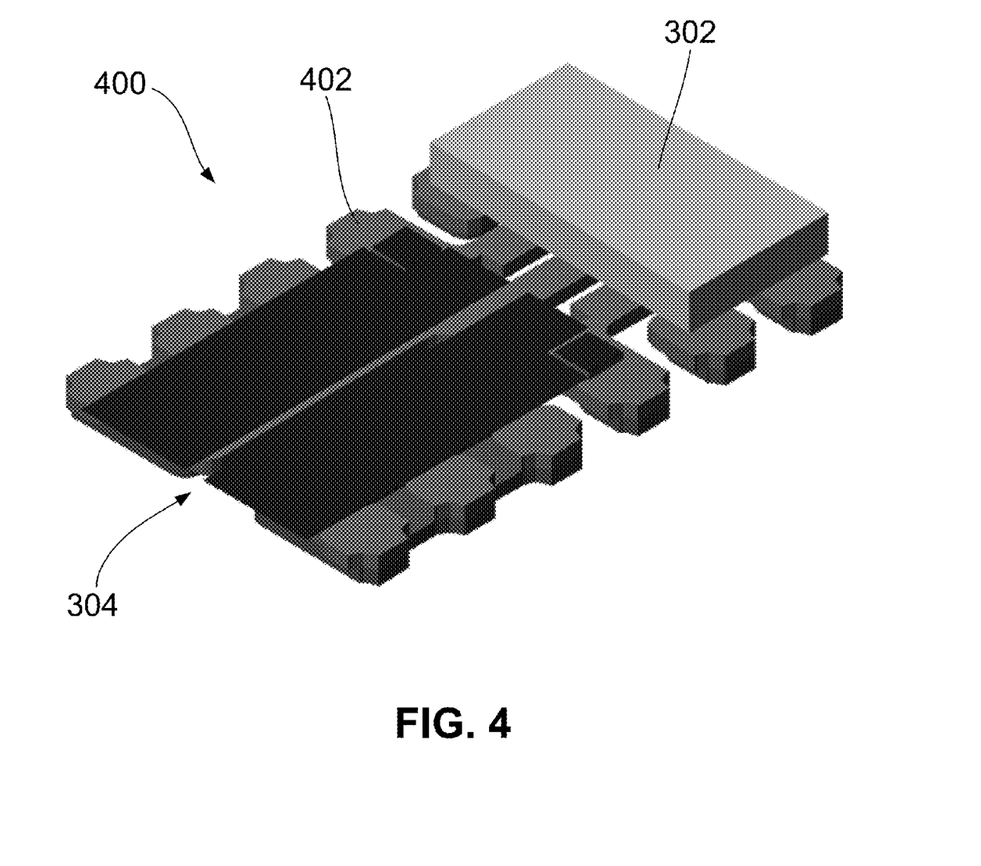
FIG. 4 illustrates a perspective view of an example multi-chip module (MCM) according to one embodiment including the protection integrated circuit (IC) and power semiconductor switch of the battery protection circuit of FIG. 3.
Figure 5:
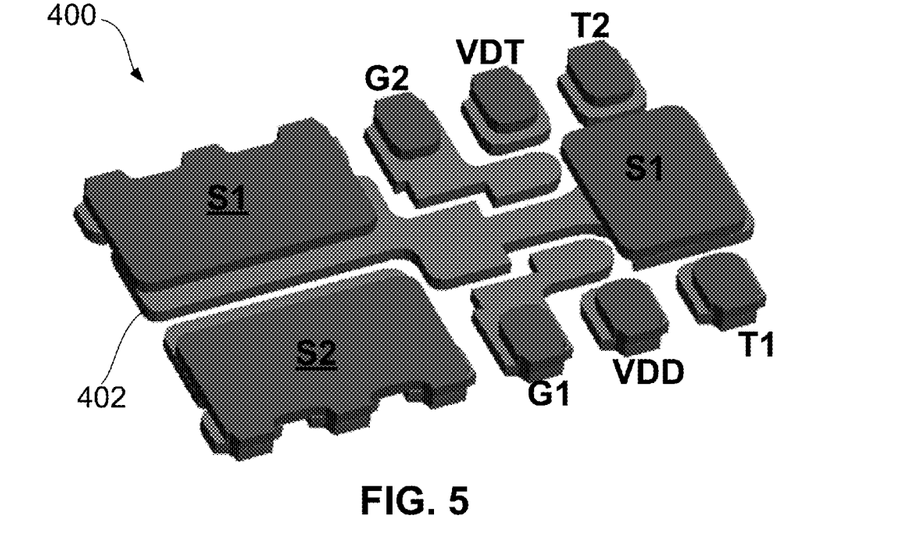
FIGS. 5 and 6 illustrate different views of portions of the MCM of FIG. 4.
Figure 6:
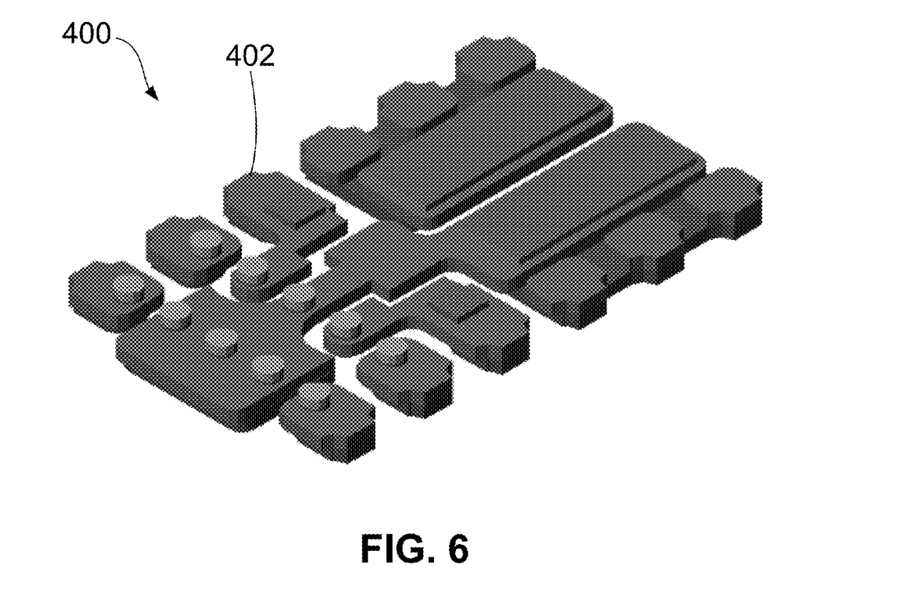
Figure 7:
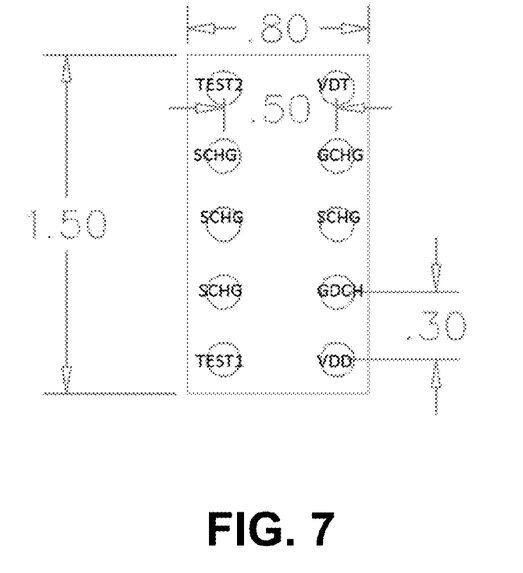
FIG. 7 illustrates an example protection IC pin out of the battery protection circuit of FIG. 3.
Figure 8:
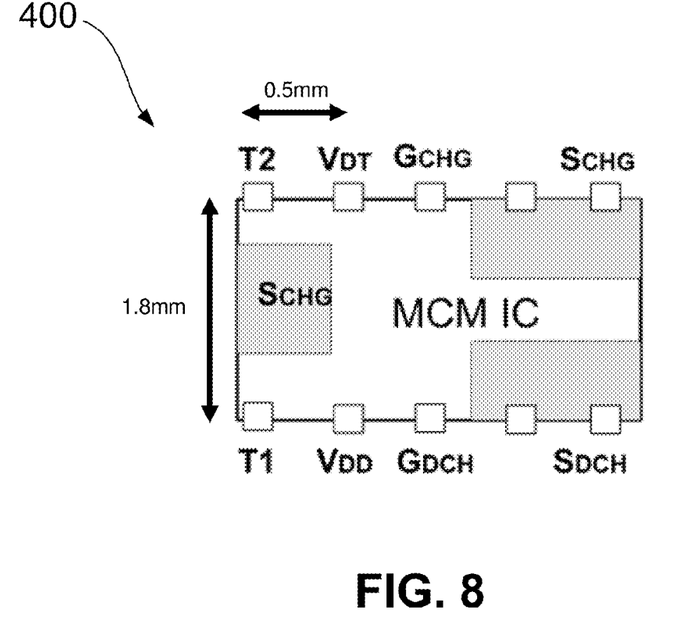
FIG. 8 illustrates an example package pin out of the MCM of FIG. 4.

FIG. 4 illustrates a perspective view of example MCM 400 according to one embodiment including protection IC 302 and power semiconductor switch 304 of battery protection circuit 300 (e.g., as shown in FIG. 3). FIGS. 5 and 6 illustrate different views of portions of MCM 400. As shown, the protection IC 302 and power semiconductor switch 304 may be both structurally and electronically coupled to a lead frame structure 402. FIG. 7 illustrates an example pin out for protection IC 302 of the battery protection circuit of FIG. 3 and FIG. 8 illustrates an example package pin out of the MCM of FIG. 4. MCM 400 may comprise both battery protection circuit 300 components, including protection IC 302 and power semiconductor switch 304, resulting in a small flip die package with ultra-low on-resistance and having a 1.8 mm width (perpendicular edge to battery). MCM 400, consistent with the present disclosure, may result in thinner battery packs and phones, including a single solution up to 8 A, resulting in ease of design and faster time to market. Having a total power protection circuitry solution in a space saving 1.8×3.5 mm package may result in increased ease of use and PCB layout simplification.

Figure 9:
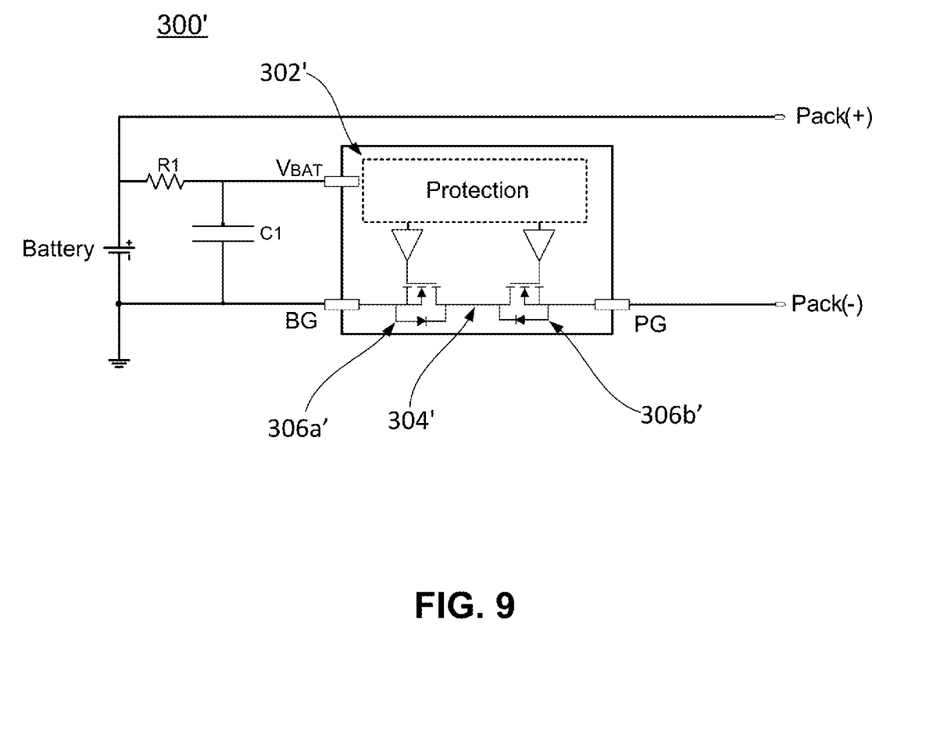
FIG. 9 illustrates an alternative configuration for a battery protection circuit consistent with the present disclosure.

FIG. 9 illustrates an alternative configuration for battery protection circuit 300' consistent with the present disclosure. As opposed to the embodiment of battery protection circuit 300 disclosed in FIG. 3 wherein control IC 302 includes pins T1 and T2 as test points usable for calibrating the protection trip point, protection IC 302' in FIG. 9 may be internally calibrated based on power semiconductor switch 304'. For example, the calibration may be performed during manufacturing of the MCM making up battery protection circuit 300'. In particular, the operational characteristics of MOSFETs 306a' and 306b' may be determined (e.g., measured) during the manufacturing process, and protection IC 302' may be calibrated based on the operational characteristics before or after final assembly of battery protection circuit 300'. The operational characteristics of power semiconductor switch 304' should remain substantially constant during the operation of battery protection circuit 302' since all components are part of the same MCM. Preconfiguring the protection trip point in this manner may allow for simpler circuit design, since on-the-fly determination of MOSFET operational characteristics are not required, and thus, a smaller size and/or lower cost for battery protection circuitry 300'. In battery protection circuit 300', the BG pin may be to connect a battery cell ground to the source of battery discharge MOSFET 306a' in battery protection circuit 300', while the PG pin may be to connect Pack(−) to the source of battery charge MOSFET 306b'.

Figure 10:
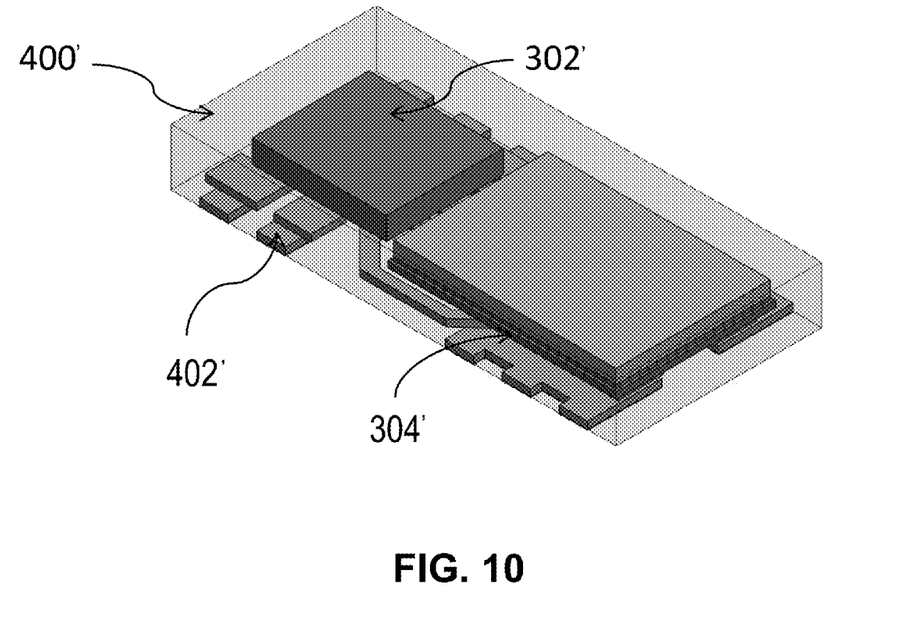
FIG. 10 illustrates an example perspective view of an example MCM according to one embodiment including the protection IC and power semiconductor switch of the battery protection circuit of FIG. 9.

FIG. 10 illustrates a perspective view of example MCM 400' according to one embodiment including protection IC 302' and power semiconductor switch 304' of battery protection circuit 300' of FIG. 9. Similar to the embodiment disclosed in FIG. 4, in MCM 400' protection IC 302' and power semiconductor switch 304' are structurally and/or electronically coupled to lead frame structure 402'. In addition to providing structural integrity and electronic conductivity, lead frame 402' may also provide thermal dissipation for heat generated by power semiconductor switch 304'. For example, large conductive pads such as BG and PG disclosed in FIG. 12 may allow for heat to be conducted away from power semiconductor switch 304' in MCM 400'.

Figure 11:
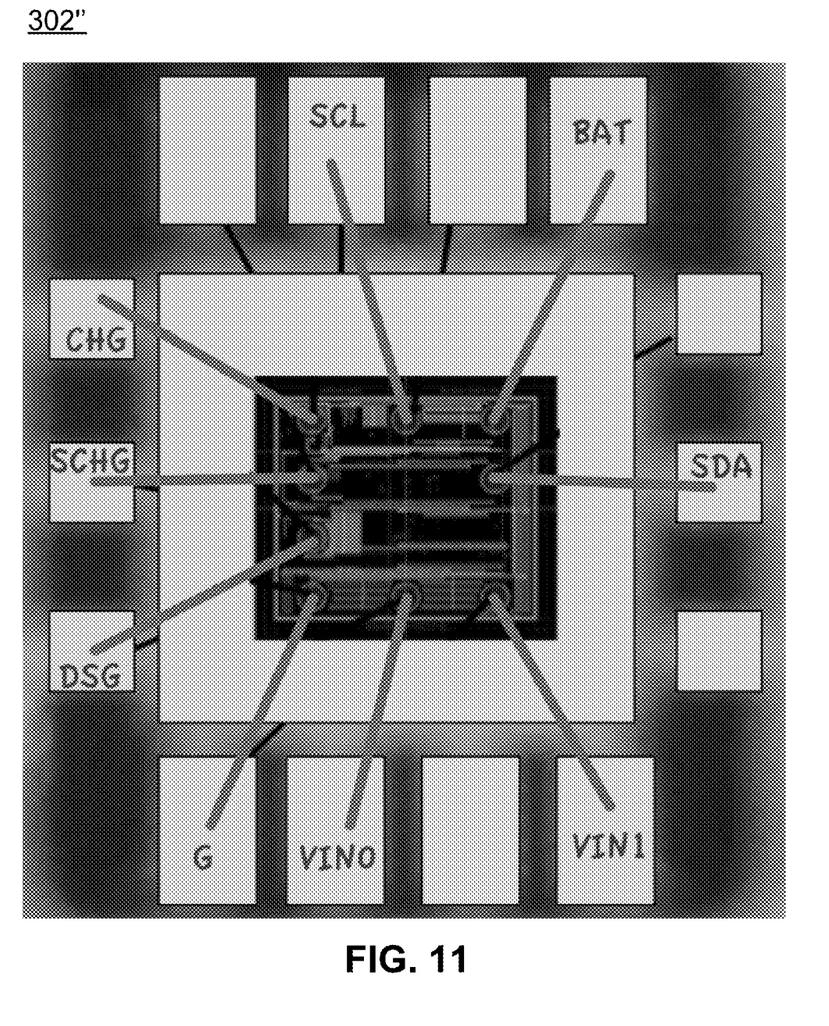
FIG. 11 illustrates an example die configuration for a protection IC consistent with the present disclosure.

FIG. 11 illustrates an example die configuration for protection IC 302'' consistent with the present disclosure. An image for an example protection IC 302" is shown in FIG. 11 along with identifications corresponding to the different input/output contacts on the die. For example, CHG may correspond to a contact for the gate driver of the battery charge MOSFET, SCHG may correspond to a contact for the source of the battery charge MOSFET, DSG may correspond to a contact for the gate driver of the battery discharge MOSFET, G may correspond to a contact for ground and BAT may correspond to a contact for a positive power supply input. The SCL, VIN0, VIN1 and SDA may be for internal use only. For example, one or more of the SCL, VIN0, VIN1 and SDA contacts may be employed in calibrating protection IC 302" based on the measured operational characteristics of power semiconductor switch 304.

Figure 12:
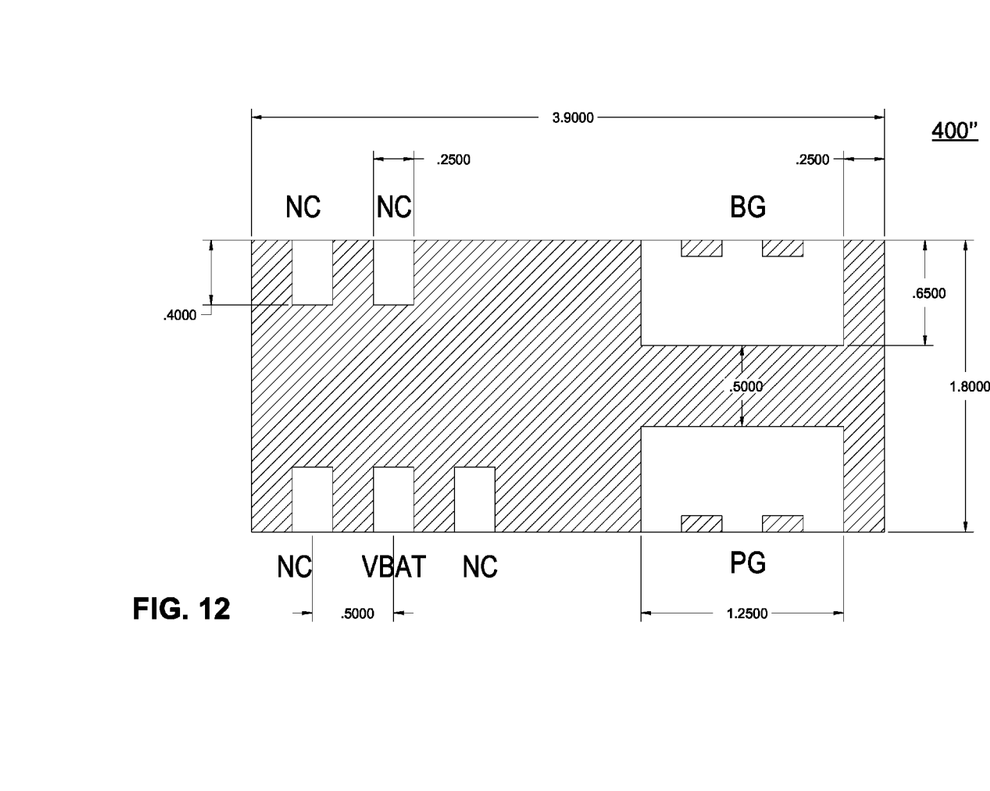
FIG. 12 illustrates an example protection IC pin out of the battery protection circuit of FIG. 9.

FIG. 12 illustrates an example protection IC pin out of the battery protection circuit of FIG. 3. MCM 400" is shown including example placements of various conductive pads along with possible pad sizes. Some conductive pads may be sized larger (e.g., pads BG and PG) for handling higher voltage and/or current than the NC and VBAT pads. Larger conductive pads may also allow for heat to be conducted away from MCM 400". Heat conductive properties may allow for thermal management of power components like power semiconductor switch 304.

Figure 13:
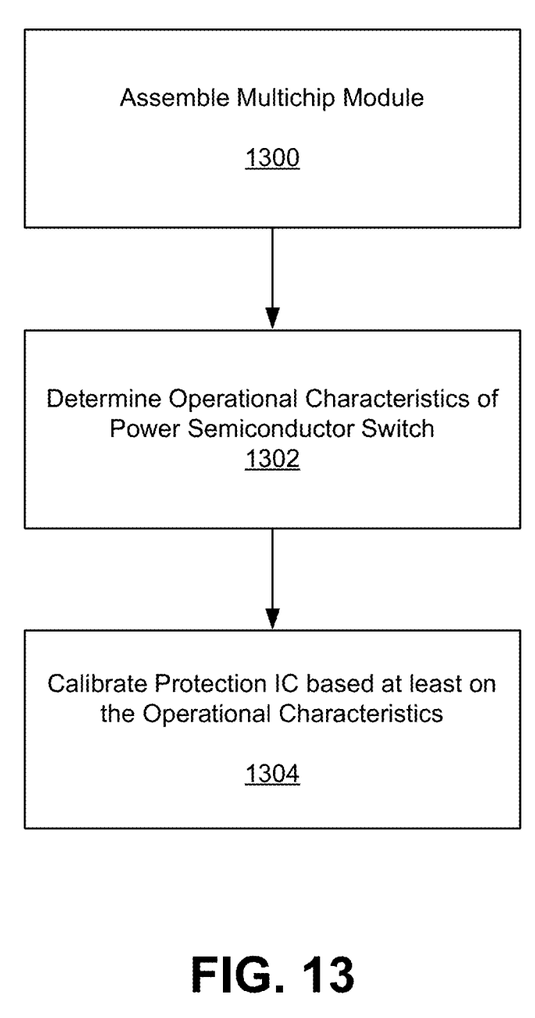
FIG. 13 illustrates example operations for a system for battery management and protection consistent with the present disclosure.

FIG. 13 illustrates example operations for a system for battery management and protection consistent with the present disclosure. In operation 1300 an MCM comprising, for example, at least a protection IC and a power semiconductor switch may be assembled. After assembly, operational characteristics for the power semiconductor switch may be determined in operation 1302. For example, the RSSon of each MOSFET making up the power semiconductor switch may be measured. In operation 1304, the protection IC may be calibrated based at least on the operational characteristics measured in operation 1302. For example, a protection trip point may be set so as to compensate for the particular RSSon measured in operation 1302. In this manner, the MCM may provide more accurate current trip point protection, resulting in higher efficiency operation and better battery life for batteries being protected by the MCM.

Certain embodiments described herein may be implemented in a system that includes one or more machine-readable storage mediums having stored thereon, individually or in combination, instructions that when executed by one or more processors perform the methods and/or operations described herein. Here, the processor may include, for example, a system CPU (e.g., core processor) and/or programmable circuitry. Thus, it is intended that operations according to the methods described herein may be distributed across a plurality of physical devices, such as processing structures at several different physical locations.

The storage medium may include any type of tangible (e.g., non-transitory) medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

"Circuitry" or "circuit", as used in any embodiment herein, may include, for example, singly or in any combination, hardwired circuitry, programmable circuitry, state machine circuitry, firmware that stores instructions executed by programmable circuitry and/or circuitry available in a larger system, for example, discrete elements that may be included as part of an integrated circuit. In addition, any of the switch devices described herein may include any type of known or after-developed switch circuitry such as, for example, MOS transistors, BJT, SiC, etc.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Thus, the present disclosure is directed to a system for battery management and protection. A battery protection circuit may include a power semiconductor switch and a control integrated circuit (IC). The battery protection circuit may be configured to regulate the charging and/or discharging of a battery and further prevent the battery from operating outside of a safe operating area based on a protection trip point (e.g. overcurrent detection point) of the protection IC. The protection IC may be configured to calibrate a protection trip point so as to compensate for process and temperature variations of on resistance (RSSon) of the power semiconductor switch.

In one example embodiment there is provided a system. The system may comprise a power source and protection circuitry to protect the power source, the protection circuitry being calibrated based on operational characteristics of components in the protection circuitry.

In another example embodiment there is provided a device. The device may comprise a power semiconductor switch and a protection integrated circuit to control the power semiconductor switch based at least on a protection trip point, the protection integrated circuit being calibrated based on operational characteristics of the power semiconductor switch.

In another example embodiment there is provided a method. The method may comprise assembling a device comprising at least a protection integrated circuit and a power semiconductor switch, determining operational characteristics for at least the power semiconductor switch and calibrating the protection integrated circuit based on the operational characteristics.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed:

1. A system for battery management and protection, comprising:
   a power source; and
   protection circuitry to protect the power source, wherein the protection circuitry includes:
   at least two metal-oxide-semiconductor field-effect transistor switches to control current going to the power source and current coming from the power source; and
   a protection integrated circuit to set at least an overcurrent detection point in the protection circuitry based on a source-to-source on state resistance measured for each of the at least two metal-oxide-semiconductor field-effect transistor switches and control operation of the at least two metal-oxide-semiconductor field-effect transistor switches based at least on the overcurrent detection point.

2. The system of claim 1, wherein the protection circuitry comprises a multichip module.

3. The system of claim 1, wherein the source-to-source on state resistance is measured by the protection integrated circuit during operation of the protection circuitry.

4. The system of claim 1, wherein the source-to-source on state resistance is measured during manufacture of the multichip module.

5. A device for battery management and protection, comprising:
   a power semiconductor switch; and
   a protection integrated circuit to control the power semiconductor switch based at least on an overcurrent detection point, the protection integrated circuit being calibrated based on a source-to-source on state resistance measured for the power semiconductor switch.

6. The device of claim 5, wherein the power semiconductor switch includes at least two metal-oxide-semiconductor field-effect transistor switches.

7. The device of claim 6, wherein the protection integrated circuit is to control a first metal-oxide-semiconductor field-effect transistor switch to control the current going to a power source and a second metal-oxide-semiconductor field-effect transistor switch to control the current coming from the power source.

8. The device of claim 5, wherein the source-to-source on state resistance is measured during manufacture of the device.

9. A method for battery management and protection, comprising:
   assembling a device comprising at least a protection integrated circuit and at least two metal-oxide-semiconductor field-effect transistor switches to control current going to a power source and current coming from the power source;
   determining an overcurrent detection point for at least the power semiconductor switch based on a source-to-source on state resistance measured for each of the at least two metal-oxide-semiconductor field-effect transistor switches; and
   setting the overcurrent detection point in the protection integrated circuit based on the source-to-source on state resistance.

10. The method of claim 9, wherein setting the overcurrent detection point is based on a trimming technique.

11. The method of claim 9, further comprising:
    protecting the power source based at least on the overcurrent detection point.

12. The method of claim 11, wherein protecting the power source comprises:
    measuring at least one of a current flowing from the power source or a current flowing to the power source;
    evaluating the measurement based on the overcurrent detection point; and
    controlling operation of the at least two metal-oxide-semiconductor field-effect transistor switches based at least on the evaluation of the measurement.

* * * * *